United States Patent [19]
Druce et al.

[11] Patent Number: 5,774,348
[45] Date of Patent: Jun. 30, 1998

[54] LIGHT-WEIGHT DC TO VERY HIGH VOLTAGE DC CONVERTER

[75] Inventors: Robert L. Druce, Union City; Hugh C. Kirbie, Dublin; Mark A. Newton, Livermore, all of Calif.

[73] Assignee: The United States of America as represented by the United States Department of Energy, Washington, D.C.

[21] Appl. No.: 669,073

[22] Filed: Jun. 24, 1996

[51] Int. Cl.$^6$ .................................................. H02M 3/07
[52] U.S. Cl. .................................................. 363/60
[58] Field of Search ........................ 363/59, 60, 61, 363/62, 140; 307/110, 109; 327/530, 537; 320/1

[56] References Cited

U.S. PATENT DOCUMENTS

| | | | |
|---|---|---|---|
| 3,943,428 | 3/1976 | Whidden | 321/15 |
| 5,270,913 | 12/1993 | Limpaecher | 363/140 |
| 5,313,384 | 5/1994 | Takeda et al. | 363/60 |
| 5,357,419 | 10/1994 | Limpaecher | 363/14 |
| 5,483,434 | 1/1996 | Seesink | 363/70 |
| 5,561,597 | 10/1996 | Limpaecher | 363/59 |

OTHER PUBLICATIONS

G. A. Mesyats et al., "Semiconductor Opening Switch Research at IEP," a paper published by the Institute of Electrophysics; Russian Academy of Science, Ural Division; 34, Komsomolskaya Str., Ekaterinburg, 602019, Russia, 1996.

*Primary Examiner*—Adolf Berhane
*Attorney, Agent, or Firm*—Robert M. Padilla; William C. Daubenspeck; William R. Moser

[57] ABSTRACT

A DC-DC converter capable of generating outputs of 100 KV without a transformer comprises a silicon opening switch (SOS) diode connected to allow a charging current from a capacitor to flow into an inductor. When a specified amount of charge has flowed through the SOS diode, it opens up abruptly; and the consequential collapsing field of the inductor causes a voltage and current reversal that is steered into a load capacitor by an output diode. A switch across the series combination of the capacitor, inductor, and SOS diode closes to periodically reset the SOS diode by inducing a forward-biased current.

6 Claims, 1 Drawing Sheet

LIGHT-WEIGHT DC TO VERY HIGH VOLTAGE DC CONVERTER

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to voltage conversion devices and more particularly to converters than can generate 10 KV to 1 MV from portable DC battery power.

2. Description of Related Art

One of the most straightforward ways to generate a high voltage from a low voltage is to use a step-up transformer or autoformer for the basic conversion. Converting DC to high voltage DC further required chopping up the incoming DC and rectifying the output DC to operate the transformer with AC currents. Low frequency operation often necessitated large, heavy bulky cores to prevent saturation at reasonable loads. The bulk of the cores has been reduced by prior art devices that operate the transformer in the kilohertz and tens of kilohertz ranges.

Converting 20–50 amps of DC at 400 volts to 10 KV, or more, capable of delivering pulse currents of 20,000+ amps every ten seconds presents a difficult challenge for all prior art systems. Portable operation in confined spaces with severe weight restrictions further makes the job of constructing such system with prior art devices all the more impossible.

PIN diodes, or something like them, could be used to generate very fast pulses in light weight charge pump conversion circuits, but conventional PIN diodes are limited in the voltages and currents that can be used. U.S. Pat. No. 5,148,267 issued Sep. 15, 1992 to Ty Tan et. al., explains that a step recovery diode is a specialized kind of PIN diode. Such step recovery diodes can also be used to produce pulses and other waveforms with extremely fast rise and fall times, e.g., 30 picoseconds. Such diodes are also commonly used in harmonic frequency multipliers because of their high efficiency in generating harmonics. Generally, a PIN diode is characterized by an undoped intrinsic ("i") region sandwiched between a heavily p-doped ("p") region and a heavily n-doped ("n") region. Step recovery diodes are subject to special design constraints different from those for other kinds of PIN diodes. For example, a step recovery diode is operated in both forward and reverse bias; and therefore both its forward and reverse characteristics are of great concern. Step recovery diodes have particular interest in the way they transition from forward to reverse bias, e.g., a large diffusion capacitance in forward bias and a small depletion capacitance in reverse bias with a rapid transition between. The intrinsic region of a step recovery diode generally comprises semiconductor materials with long minority carrier lifetimes, at least several nanoseconds, to maximize the storage of charge when in forward bias and thereby provide as large a diffusion capacitance as possible. Also, the intrinsic region must be very thin, typically less than about 10,000 Å; and the junctions between the intrinsic region and the other regions have abrupt doping profiles. Such transition widths are less than about 300 Å to provide abrupt carrier confinement at the junctions. Such tends to ensure a rapid transition between forward and reverse bias. Compromises must be made, for example, between configuring the diode structure so as to maximize the speed of transition or to maximize the reverse diode breakdown voltage, to achieve the best overall performance in a given circuit. A high concentration of two types of charge carriers throughout the middle intrinsic region effectively stores both types of carriers in that region. This is equivalent to charging a capacitor. The higher the concentration of carriers in the intrinsic region, the higher the capacitance of the diode. Such capacitance occurs as a result of diffusion of charge carriers under forward bias and therefore is referred to as forward bias or "diffusion" capacitance.

Applying a reverse bias draws the charge carriers out of the intrinsic region. Specifically, the holes are drawn back into the $p^+$ region and the electrons are drawn back into the $n^+$ region, thereby depleting the intrinsic region of mobile charge carriers. After the carriers have been removed from the intrinsic region, there is practically no current flow. Thus, under reverse bias, the diode may be considered as behaving much like a parallel plate capacitor having a spacing between the plates substantially equal to the thickness of the intrinsic region. This capacitance occurs as a result of depletion of charge carriers from the intrinsic region and is referred to as reverse bias or "depletion" capacitance. The depletion capacitance is substantially smaller than the diffusion capacitance.

Most conventional step recovery diodes are fabricated on silicon using vapor phase epitaxy, ion beam implantation and diffusion techniques. The minority carrier lifetimes in the intrinsic region of a silicon-based step recovery diode are relatively long, typically longer than about five nanoseconds, resulting in a relatively high diffusion capacitance. The maximum output voltage achievable with such a device has been around 15 volts. It has been proposed to increase the maximum output voltage that can be obtained from a step recovery diode by making the diode out of a semiconductor compound made of a group III material such as gallium and a group V material such as arsenic. Even so, the operating voltages and currents would not reach the levels required for the applications mentioned above.

SUMMARY OF THE INVENTION

An object of the present invention is to provide a DC-DC converter capable of producing 100 KV and more from batteries.

A further object of the present invention is to provide a DC-DC converter that is light weight and capable of fitting within very constrained spaces.

Briefly, a DC-DC converter of the present invention comprises a silicon opening switch (SOS) diode connected to allow a charging current from a capacitor to flow into an inductor. When a specified amount of charge has flowed through the SOS diode, it opens up abruptly; and the consequential collapsing field of the inductor causes a voltage and current reversal that is steered into a load capacitor by an output diode. A switch across the series combination of the capacitor, inductor, and SOS diode closes to periodically reset the SOS diode by inducing a forward-biased current.

An advantage of the present invention is a DC-DC converter is provided for producing high voltage DC.

Another advantage of the present invention is a DC-DC converter system is provided that can be light weight and confined to small spaces.

DETAILED DESCRIPTION OF THE INVENTION

Figure 1:
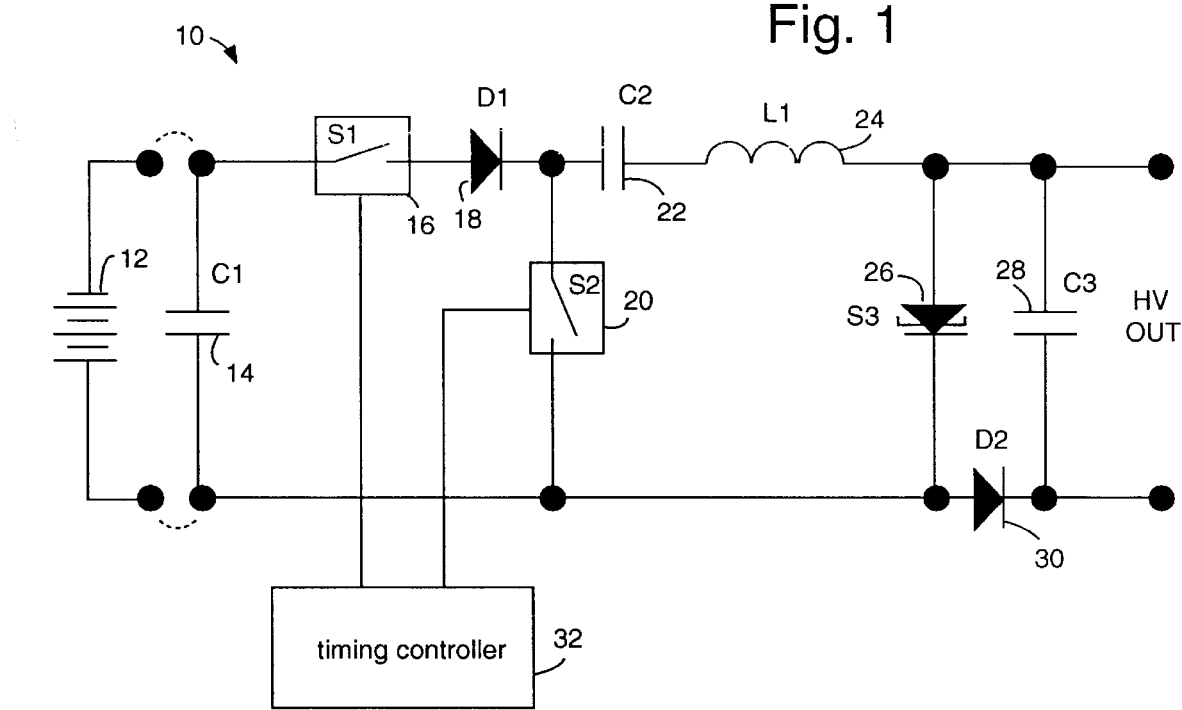
FIG. 1 is a schematic diagram of DC-DC voltage converter embodiment of the present invention.

FIG. 1 illustrates a DC-DC voltage converter embodiment of the present invention, referred to herein by the general reference numeral 10. The converter 10 can be powered by a battery 12 or any of a number of equivalent sources, e.g., photovoltaic cell stacks connected to receive laser pulses, explosion-driven piezoelectric cells, etc. A capacitor (C1) 14 collects and stores the input voltage and can be on the order of 100 μFd and have 400 volts applied. The converter further includes a series switch (S1) 16, a diode (D1) 18, a shunt switch (S2) 20, a capacitor (C2) 22, an inductor (L1) 24, a silicon opening switch (SOS) diode 26, a high voltage output capacitor (C3) 28 and an output diode (D2) 30. When battery 12 is used, capacitor (C1) 14 can be omitted.

In operation, the S1 switch 16 is periodically closed to charge the C2 capacitor 22 through the D1 diode 18. The C2 capacitor 22 is typically 1.0 μfd. The S2 switch 20 is synchronized to then close a circuit that will apply the charge of the C2 capacitor 22 across the L1 inductor 24. The L1 inductor 24 is typically 900 nH. The SOS diode 26 opens to interrupt the charging current after a specified amount of charge has passed through, e.g., as determined by the device characteristics. Such opening causes the L1 inductor 24 to reverse voltage and send a current to charge the C3 capacitor 28 through the now forward-biased D2 diode 30. In order to reset the SOS diode 26, a forward bias current through it is required for a brief but well-defined period. Such reset is provided by closing the S1 switch and opening the S2 switch 20, which also begins a new cycle that charges the C2 capacitor 22. The output voltage is successively built up, e.g., charge pumped, to about 100 KV in a series of small steps that are initiated by the coordinated opening and closing of the S1 and S2 switches 16 and 20. Such switches can be low voltage types, as neither is subjected to the high voltages of the output.

The SOS diode 26 is a 100 KV 800 amp (peak) type that was obtained by the present inventors from the Institute of Electrophysics, Russian Academy of Science, 34, Komsomolskaya Str., Ekaterinburg, 620049, Russia, for about US$ $2,000. The SOS effect is described by G. A. Mesyats, S. N. Rukin, S. K. Lyubutin, S. A. Darznek, Ye. A. Litvinov, V. A. Telnov, S. N. Tsiranov, and A. M. Turov, in a paper published by the Institute of Electrophysics, titled, "SEMICONDUCTOR OPENING SWITCH RESEARCH AT IEP". A copy of which is of record in this Application. According to Mesyats et al., their main challenge was to develop a high-power repetitive solid-state opening switch capable of quickly switching off kiloampere currents in the nanosecond range and capable of withstanding $10^6$ volts.

The SOS effect has been observed by Mesyats et al., to occur at a current densities as high as 60 kA/cm$^2$ in silicon p$^+$-p-n-n$^+$ structures filled by residual electron-hole plasmas with concentrations of $10^{16}$–$10^{17}$ cm$^{-3}$. Abrupt reverse current interruptions in semiconductor diodes were observed in the 1950s, e.g., charge storage diodes (CSD) or step recovery diodes. See Yu. R. Nosov, "Fast recovery semiconductor diodes", Moskva: Soviet Radio, 1965 (in Russian). And see U.S. Pat. No. 5,148,267 issued Sep. 15, 1992 to Ty Tan et. al. Typical structures include stacks of eighty or more p$^+$-p-n-n$^+$ devices in series connection.

Mesyats et al., observed that in 1983 I. V. Grekhov realized a drift step recovery diode (DSRD) with a p$^+$-n-n$^+$ structure capable of a current interruption density as great as 160 A/cm$^2$, a current interruption time of about two nanoseconds, and a breakdown voltage of about one kilovolt. See V. M. Tuchkevich, I. V. Grekhov, "New principles of switching high power by semiconductor devices", Leningrad: Nauka, 1988 (in Russian). A short, hundreds of nanoseconds, forward pumping pulse is used to form a thin layer of injected plasma in the base near a p-n junction and such provides for most of a stored charge. When a reverse current flows, the plasma layer dissipates at the p-n junction and the holes drift from the remainder of the base. By selecting the base width and level of doping and the duration and density of current of the pumping mode, the drift current density at the instant that all the nonequilibrium carriers are depleted can be maximized for particular base doping levels. Reverse current interruption depends on the removal of the equilibrium carriers from the base, e.g., at a maximum saturation rate of approximately $10^7$ cm/s. DSRD's are thus limited in their current densities. For a reverse voltage of about 1–2 kV across the structure, the level of the donor impurity in the base may not exceed $10^{14}$ cm$^{-3}$, at which the cut-off point corresponds to a maximum current density of about 100–160 A/cm$^2$.

The SOS effect is characterized by super-high injection levels, e.g., plasma concentrations that can be as high as $10^{18}$ cm$^{-3}$, with current densities in the units and tens of kA/cm$^2$. At such current densities, double injection predominates. During forward conductivity, holes enter the structure from the p$^+$-region and electrons enter from the n$^+$-region. The carriers move such that it takes them units and tens of nanoseconds to traverse the base region where the concentration is low and the field is high. Such carriers are slowed by high concentration regions on the order of hundreds of nanoseconds, which is equivalent to stopping the particles and any accumulation of them. The main part of the stored charge is in the form of a quasi-neutral electron-hole plasma near the highly doped regions' boundaries. Reversing current removes such stored charges. The highly doped p$^+$-region absorbs holes and the n$^+$-region absorbs electrons. Two concentration fronts of excess plasma are formed, one in the p-region, and the other in the n$^+$-region. Main current is promoted by drift mode majority equilibrium carriers. Current interruption is initiated at those points where the plasma concentration will be at a minimum, e.g., a first point in the p-region where the concentration of excess plasma equals that of equilibrium plasma, a second similar point in the n$^+$-region, and a third point with a minimum concentration of excess plasma. For example, at a point in the p-region which is free of injected plasma, but close to the propagating front of the concentration wave, the current passing Jp$^-$(t) the point can be described by, $$Jp^-(t) = e^- N_a(t) \cdot V_P(t),$$

where $N_a(t)$ is the concentration of acceptor atoms in the p-region. At the point of high reverse conductivity, an increase in the drift velocity of holes $V_P$ simultaneously compensates for a rise in the current density $J_P^-$ and a drop in $N_a$ because the point moves to the region with a lower concentration of acceptor atoms. As soon as a saturation velocity is reached, the process of current interruption by the structure commences. At the point of current interruption a decrease in $J_P^-$ corresponds to a drop of $N_a$ because the excess plasma boundary continues moving to the right and downwards. Still, the main process that determines current interruption is an intense depletion of equilibrium holes from the region of the volume charge formed. At the point the reverse current is interrupted, the base has excess plasma with concentrations several dozens of times higher than the starting donor impurity concentration. The volume charge regions are responsible for current interruption, and appear in narrow highly doped p and n+ regions. At the point the reverse bias current is interrupted, an intensive avalanche multiplication of carriers takes place in the volume charge regions.

Although particular embodiments of the present invention have been described and illustrated, such is not intended to limit the invention. Modifications and changes will no doubt become apparent to those skilled in the art, and it is intended that the invention only be limited by the scope of the appended claims.

The Invention claimed is:

1. A low voltage DC to high voltage DC power converter, comprising:

a silicon opening switch (SOS) (26) that provides for the passing of a reversed-biased current up until a predetermined amount of charge has passed through and that then abruptly opens, wherein a reset is provided by a forward-biased current;

an input network connected across the SOS (26) and that includes a series connection of a first switch (20), a first capacitor (22) and an inductor (24), wherein an input voltage is accepted across the first switch (20), while open, that charges said first capacitor (22) through said inductor (24) and the SOS (26); and an output network connected across the SOS (26) and that includes a series connection of a diode (30) and a second capacitor (28), wherein a charge pumping of said second capacitor (28) to a high voltage occurs by interrupting current through said inductor (24) in successive cycles of forward and reverse biasing the SOS (26) with the first switch (20).

2. The converter of claim 1, further comprising:

a second diode (18) and a second switch (16) connected in series with an external input power supply (12) and the combination connected across said first switch (20).

3. The converter of claim 2, further comprising:

a timing controller (32) connected to control and coordinate the opening and closing of said first (20) and second (16) switches to favor said charge pumping.

4. The converter of claim 1, wherein:

the SOS (26) comprises a stack of silicon $p^+$-p-n-$n^+$ structures in series connection.

5. A DC-DC converter, comprising:

an input capacitor (14) for receiving a low voltage DC power supply (12);

a first switch (16) and a first diode (18) in series connection with the input capacitor (14), wherein the first diode (18) is generally forward biased when the first switch (16) is closed;

a second switch (20) in shunt connection with the first switch (16), the first diode (18) and the input capacitor (14);

a second capacitor (22) and an inductor (24) in series connection between a junction of the first diode (18) and the second switch (20), and a first output load connection;

a third capacitor (28) connected in shunt between said first output load connection and a second output load connection;

a silicon opening switch (SOS) diode (26) with internal silicon $p^+$-p-n-$n^+$ structures in series connection, and connected in series combination with the second capacitor (22) and the inductor (24) to shunt the second switch (20); and a second diode (30) connected between said second output load connection and a junction between the input capacitor (14), the second switch (20) and the SOS diode (26);

wherein, closing the first switch (16) and opening the second switch (20) causes the second capacitor (22) to charge through the inductor (24) and the forward biased SOS diode (26), and then closing the second switch (20) applies the charge of the second capacitor (22) across the inductor (24) until the SOS diode (26) abruptly interrupts the current and causes a voltage reversal in the inductor (24), and forward biases the second diode (30) pumping a charge onto the third capacitor (28), and wherein closing the first switch (16) and opening the second switch (20) causes the SOS diode (26) to reset by being forward biased.

6. The converter of claim 5, further comprising:

a timing controller (32) connected to control and coordinate the opening and closing of said first (16) and second (20) switches to favor a charge pumping of the third capacitor (28) to voltages in excess of 10 KV.

* * * * *